(12) United States Patent
Kaji (10) Patent No.: US 11,837,514 B2
(45) Date of Patent: Dec. 5, 2023

(54) SEMICONDUCTOR DEVICE AND POWER CONVERTER

(71) Applicant: Mitsubishi Electric Corporation, Tokyo (JP)

(72) Inventor: Yusuke Kaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 392 days.

(21) Appl. No.: 17/319,186

(22) Filed: May 13, 2021

(65) Prior Publication Data

US 2022/0165630 A1 May 26, 2022

(30) Foreign Application Priority Data

Nov. 26, 2020 (JP) ................. 2020-196241

(51) Int. Cl.
| | |
|---|---|
| *H01L 23/10* | (2006.01) |
| *H01L 23/04* | (2006.01) |
| *H01L 23/053* | (2006.01) |
| *H02M 7/48* | (2007.01) |
| *H01L 23/00* | (2006.01) |
| *H01L 25/07* | (2006.01) |
| *H01L 25/18* | (2023.01) |

(52) U.S. Cl.
CPC .............. *H01L 23/10* (2013.01); *H01L 23/04* (2013.01); *H01L 23/053* (2013.01); *H01L 24/73* (2013.01); *H01L 25/072* (2013.01); *H01L 25/18* (2013.01); *H01L 2224/73265* (2013.01); *H01L 2924/1033* (2013.01); *H01L 2924/10254* (2013.01); *H01L 2924/10272* (2013.01)

(58) Field of Classification Search
CPC ....... H01L 23/10; H01L 23/04; H01L 23/053; H01L 24/73; H01L 25/072; H01L 25/18; H01L 2224/73265; H01L 2924/10254; H01L 2924/10272; H01L 2924/1033
See application file for complete search history.

(56) References Cited

U.S. PATENT DOCUMENTS

| | | | | |
|---|---|---|---|---|
| 5,243,223 | A | * | 9/1993 | Yamada ................. H01L 23/04 |
| | | | | 257/714 |
| 2019/0164857 | A1 | * | 5/2019 | Murata ................... H01L 23/08 |
| 2019/0371686 | A1 | * | 12/2019 | Harada ................... H01L 25/18 |
| 2021/0082778 | A1 | | 3/2021 | Kaji et al. |

FOREIGN PATENT DOCUMENTS

WO    2019/239615 A1    12/2019

* cited by examiner

*Primary Examiner* — Peniel M Gumedzoe
(74) *Attorney, Agent, or Firm* — Studebaker & Brackett PC (57) ABSTRACT

According to an aspect of the first disclosure, a semiconductor device includes a base plate, a case that surrounds a region immediately above the base plate, a semiconductor chip provided in the region, a sealing resin that fills the region and a barrier layer provided on the sealing resin, wherein the barrier layer has a first surface facing the base plate, a second surface opposite to the first surface, and a convex part protruding upward from the second surface, the first surface has a longer distance to the base plate as getting farther from the center, the convex part is provided avoiding the center, and a height of the convex part is greater than a distance in a thickness direction of the barrier layer between a portion of the first surface immediately below the convex part and a portion of the first surface provided at the center.

19 Claims, 9 Drawing Sheets

SEMICONDUCTOR DEVICE AND POWER CONVERTER

BACKGROUND OF THE INVENTION

Field

The present disclosure relates to a semiconductor device and a power converter.

Background

A power semiconductor module is disclosed in International Publication No. WO 2019239615. The power semiconductor module includes an insulating substrate, a first conductive circuit pattern, a second conductive circuit pattern, a first semiconductor device, a second semiconductor device, a sealing member, and a barrier layer. The sealing member seals the first semiconductor device, the second semiconductor device, the first conductive circuit pattern, and the second conductive circuit pattern. The barrier layer prevents moisture and gas such as sulfur gas from entering the inside of the power semiconductor module. The sealing member is provided with a stress relaxation part. The outer surface of the sealing member is formed so as to be gradually deeply recessed toward the center of the power semiconductor module at least in the stress relaxation part.

In International Publication No. WO 2019239615, the barrier layer protrudes downward to form the stress relaxation part in the sealing member. The barrier layer with such a structure has difficulties in standing still in a horizontal state and may not be stacked stably. Also, the barrier layer may tilt or fall at the time of being obtained so as to be mounted in a semiconductor device.

SUMMARY

The present disclosure has been made to solve the problem described above, and it is an object of the present disclosure to provide a semiconductor device and a power converter in which barrier layers can be stacked stably.

The features and advantages of the present disclosure may be summarized as follows.

According to an aspect of the first disclosure, a semiconductor device includes a base plate, a case that surrounds a region immediately above the base plate in plan view, a semiconductor chip provided in the region, a sealing resin that fills the region and a barrier layer provided on the sealing resin, wherein the barrier layer has a first surface facing the base plate, a second surface opposite to the first surface, and a convex part protruding upward from the second surface, the first surface has the shortest distance to the base plate at a center of the barrier layer and has a continuously longer distance to the base plate as getting farther from the center, the convex part is provided at least on each of both sides of the center, while avoiding the center, and a height of the convex part from the second surface is greater than a distance in a thickness direction of the barrier layer between a portion of the first surface immediately below the convex part and a portion of the first surface provided at the center.

According to an aspect of the second disclosure, a semiconductor device includes a base plate, a case that surrounds a region immediately above the base plate in plan view, a semiconductor chip provided in the region, a sealing resin that fills the region and a barrier layer provided on the sealing resin, wherein the barrier layer has a first surface facing the base plate, a second surface opposite to the first surface, and a convex part protruding downward from the first surface, the first surface has the shortest distance to the base plate at a center of the barrier layer and has a continuously longer distance to the base plate as getting farther from the center, the convex part is provided at least on each of both sides of the center, while avoiding the center, and a height of the convex part from the second surface is greater than a thickness of the barrier layer at the center.

Other and further objects, features and advantages of the disclosure will appear more fully from the following description.

DESCRIPTION OF EMBODIMENTS

Semiconductor devices and Power converters according to embodiments of the present disclosure will be described with reference to the accompanying drawings. Components identical or corresponding to each other are indicated by the same reference characters, and repeated description of them is avoided in some cases.

First Embodiment

Figure 1:
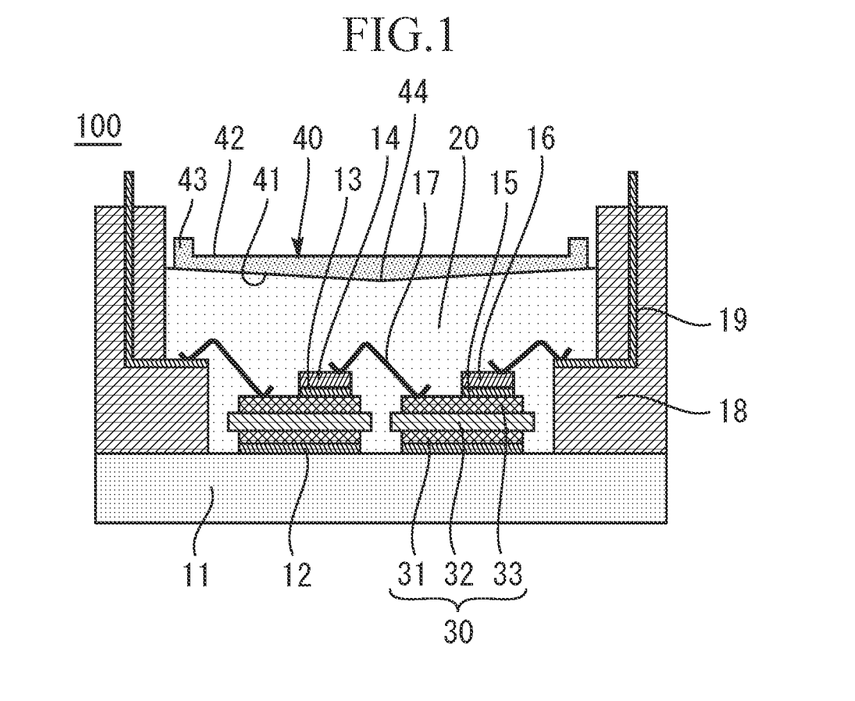
FIG. 1 is a cross-sectional view of a semiconductor device according to a first embodiment.

FIG. 1 is a cross-sectional view of a semiconductor device 100 according to a first embodiment. The semiconductor device 100 includes a base plate 11 and a case 18 surrounding a region immediately above the base plate 11 in plan view. In the region surrounded by the case 18, a plurality of semiconductor chips 14, 16 and a plurality of insulating substrates 30 are provided. The plurality of insulating substrates 30 are bonded to the upper surface of the base plate 11 with a bonding material 12. The semiconductor chip 14 is mounted on the insulating substrate 30 with a bonding material 13. The semiconductor chip 16 is mounted on the insulating substrate 30 with a bonding material 15.

A terminal 19 is inserted in the case 18. The insulating substrate 30 is connected to the terminal 19 by a wiring material 17. The semiconductor chips 14, 16 are electrically connected to the outside of the semiconductor device 100 via the insulating substrates 30, the wiring materials 17, and the terminals 19. The semiconductor chips 14, 16 are electrically connected via the insulating substrate 30 and the wiring material 17.

The region surrounded by the case 18 is filled with a sealing resin 20. A barrier layer 40 is provided on the sealing resin 20.

Although two insulating substrates 30 are illustrated in FIG. 1, the insulating substrate 30 may be further provided depending on the rated capacity and wiring specifications of the semiconductor device 100. The semiconductor device 100 may include one insulating substrate 30. The semiconductor device 100 only needs to include one or more semiconductor chips.

The material of the base plate 11 is not limited. The base plate 11 may be made of a metallic material such as copper, aluminum, or a copper-molybdenum alloy (CuMo). The base plate 11 may be made of a composite material such as a silicon carbide-aluminum composite material (AlSiC) or a silicon carbide-magnesium composite material (MgSiC). The base plate 11 may be made of an organic material such as epoxy resin, polyimide resin, acrylic resin, or polyphenylene sulfide (PPS) resin.

The insulating substrate 30 has a conductive part 31, an insulating layer 32, and a conductive circuit part 33. The insulating substrate 30 may have a plurality of conductive circuit parts 33 depending on the rated capacity and wiring specifications of the semiconductor device 100.

The material of the insulating layer 32 is not limited. The insulating layer 32 may be made of an inorganic ceramic material such as alumina ($Al_2O_3$), aluminum nitride (AlN), silicon nitride ($Si_3N_4$), silicon dioxide ($SiO_2$), or boron nitride (BN). The insulating layer 32 may be formed by dispersing at least one of fine particles and fillers in the resin material. The fine particles and the fillers may each be made of an inorganic ceramic material. The inorganic ceramic material is, for example, alumina ($Al_2O_3$), aluminum nitride (AlN), silicon nitride ($Si_3N_4$), silicon dioxide ($SiO_2$), boron nitride (BN), diamond (C), silicon carbide (SiC), or boron oxide ($B_2O_3$). The fine particles and the fillers may each be made with a resin material such as silicone resin or acrylic resin. The resin in which the fine particles or the fillers are dispersed has electrical insulation. The resin in which the fine particles or the fillers are dispersed is not limited. The resin in which the fine particles or the fillers are dispersed may be made of epoxy resin, polyimide resin, silicone resin, or acrylic resin.

The materials of the conductive part 31 and the conductive circuit part 33 are not limited. The conductive part 31 and the conductive circuit part 33 may each be formed of a metallic material such as copper or aluminum. The conductive part 31 and the conductive circuit part 33 may be formed of the same material or different materials. The conductive part 31 may also serve as the base plate 11. In this instance, the insulating layer 32 is formed on the conductive part 31 also serving as the base plate 11, and one or more conductive circuit parts 33 are formed on the insulating layer 32.

The case 18 is made with a material having electrical insulation. The case 18 may be made of, for example, epoxy resin, polyimide resin, acrylic resin, or polyphenylene sulfide (PPS) resin.

The sealing resin 20 is formed of, for example, silicone gel or epoxy resin. The sealing resin 20 may be formed of an insulating resin such as silicone resin, urethane resin, polyimide resin, polyamide resin, or acrylic resin. The sealing resin 20 may be formed of an insulating resin material in which fine particles or fillers for improving strength and thermal conductivity are dispersed. The fine particles and the fillers may each be made of an inorganic ceramic material. The inorganic ceramic material is, for example, alumina ($Al_2O_3$), aluminum nitride (AlN), silicon nitride ($Si_3N_4$), silicon dioxide ($SiO_2$), boron nitride (BN), diamond (C), silicon carbide (SiC), or boron oxide ($B_2O_3$).

The barrier layer 40 is made with a material having low permeability to moisture or gas. The barrier layer 40 is made with, for example, a material having a lower permeability to moisture or gas than the sealing resin 20. The barrier layer 40 prevents gas or moisture, to which the semiconductor device 100 may be exposed in the operating environment, from entering inside of the semiconductor device 100. The gas is, for example, sulfur gas.

The barrier layer 40 is made with, for example, a thermoplastic resin such as polyphenylene sulfide (PPS), polybutylene terephthalate (PBT), or polyether ether ketone (PEEK). The barrier layer 40 may be made with a thermosetting resin, a fluorine resin such as polytetrafluoroethylene (PTFE), a ceramic material, or a glass material. The barrier layer 40 may be made of a mixture of these materials.

The barrier layer 40 has a first surface 41 facing the base plate 11, a second surface 42 opposite to the first surface 41, and a convex part 43 protruding upward from the second surface 42. The first surface 41 protrudes downward. The first surface 41 has the shortest distance to the base plate 11 at the center of the barrier layer 40. The distance between the first surface 41 and the base plate 11 becomes longer continuously as the distance to the center of the barrier layer 40 increases. The first surface 41 is inclined from a vertex 44 toward the peripheral portion.

Figure 2:
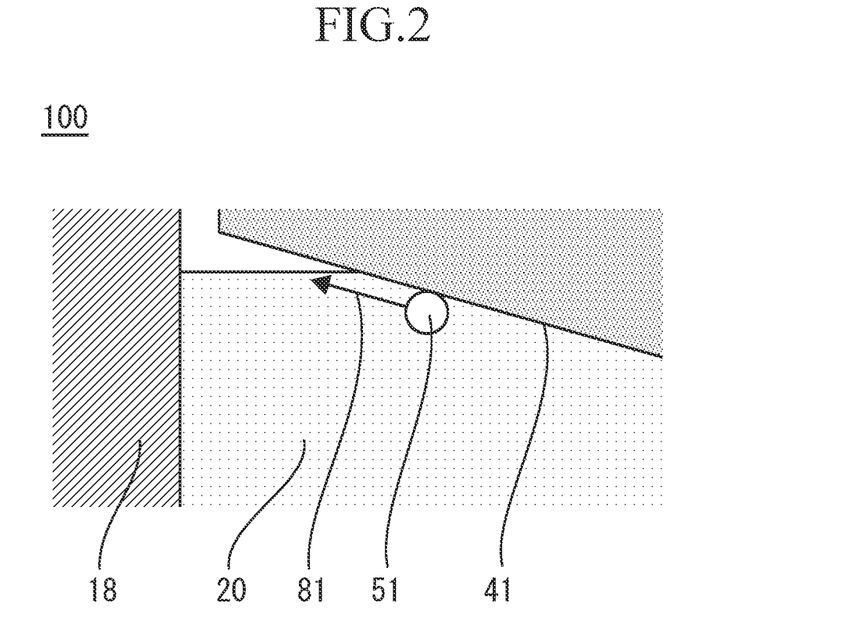
FIG. 2 is an enlarged view of the semiconductor device according to the first embodiment.

FIG. 2 is an enlarged view of the semiconductor device 100 according to the first embodiment. At the time of mounting the barrier layer 40 on the sealing resin 20, the protrusion of the first surface 41 first comes into contact with the sealing resin 20. Thereafter, the contact portion between the barrier layer 40 and the sealing resin 20 expands along the inclination of the first surface 41. Finally, the barrier layer 40 is stabilized in a state where the entire first surface 41 is in contact with the sealing resin 20.

At this time, even when bubbles 51 are trapped at the time of the contact between the barrier layer 40 and the sealing resin 20, the bubbles 51 are released to the peripheral portion of the barrier layer 40 along the inclination of the first surface 41. Hence the bubbles 51 are discharged from between the barrier layer 40 and the case 18. The presence of the bubbles 51 in the semiconductor device 100 may cause a change in stress distribution. In addition, the insulation may deteriorate. In the present embodiment, the bubbles 51 remaining inside the semiconductor device 100 can be reduced. It is thus possible to obtain the semiconductor device 100 being environmentally resistant and highly reliable.

Figure 3:
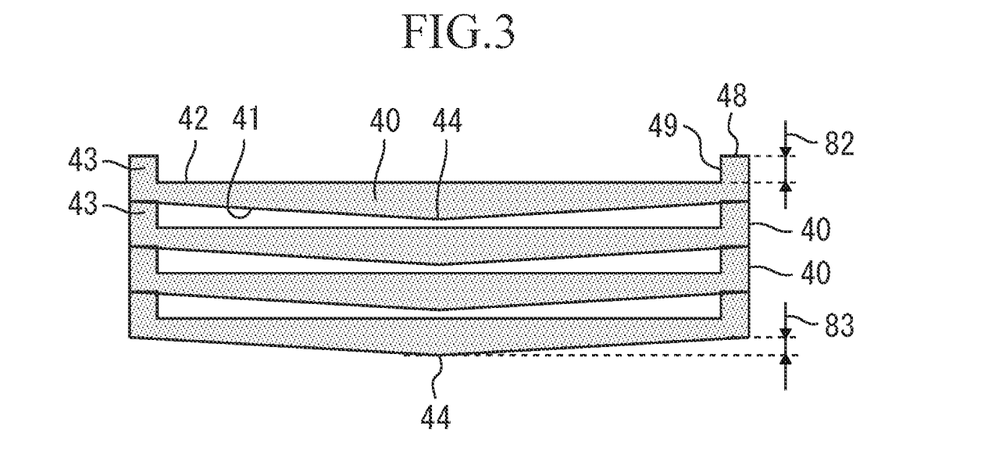
FIG. 3 is a view illustrating a state where the barrier layers according to the first embodiment are stacked.

FIG. 3 is a view illustrating a state where the barrier layers 40 according to the first embodiment are stacked. In the manufacturing process of the semiconductor device 100, for example, the barrier layers 40 are continuously mounted on the sealing resin 20 with respect to the plurality of semiconductor devices 100. At this time, by storing the barrier layers 40 in piles, it is possible to save space and improve work efficiency during the mounting work.

In the present embodiment, when the barrier layers 40 are stacked, the protrusion of the first surface 41 of the barrier layer 40 can be housed in the space formed by the convex parts 43. Therefore, the barrier layers 40 can be stacked stably. That is, the barrier layers 40 can be stacked while the inclination of the barrier layers is prevented. When the barrier layer 40 is to be manually or automatically obtained in a state where the barrier layer 40 is inclined, the barrier layer 40 may fall. Further, the barrier layer 40 may be mounted in the inclined state. In the present embodiment, the semiconductor device 100 of stable quality can be provided due to the convex part 43.

The convex part 43 is provided so as to be able to hold the barrier layer 40 immediately above the convex part 43. Specifically, the convex parts 43 are provided at least on both sides of the center of the barrier layer 40 while avoiding the center of the barrier layer 40.

The convex part 43 is provided so as to be able to house the protrusion of the first surface 41. Specifically, a height 82 of the convex part 43 from the second surface 42 is greater than a distance 83 in the thickness direction of the barrier layer 40 between the portion of the first surface 41 immediately below the convex part 43 and the portion of the first surface 41 provided at the center of the barrier layer 40. In the present embodiment, the convex part 43 is provided at the edge of the barrier layer 40. In this instance, the height 82 of the convex part 43 is greater than the difference in the height of the first surface 41 between the edge and the center of the barrier layer 40. The height 82 of the convex part 43 may be greater than the height from the contact portion with the convex part 43 to the vertex 44 of the first surface 41.

With such a configuration, when the barrier layers 40 are stacked, the stacking is possible without the protrusion of the first surface 41 coming into contact with the barrier layer 40 immediately below the protrusion. Considering the size of the semiconductor device 100, the height 82 of the convex part 43 is preferably from 0.1 to 10 mm, and more preferably from 0.5 to 3 mm.

Figure 4:
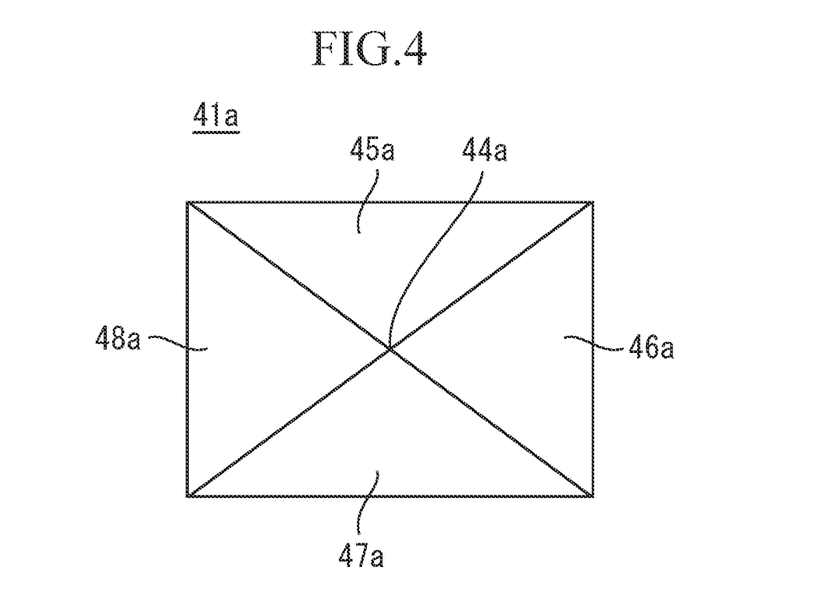
FIG. 4 is a bottom view illustrating an example of a first surface.
Figure 5:
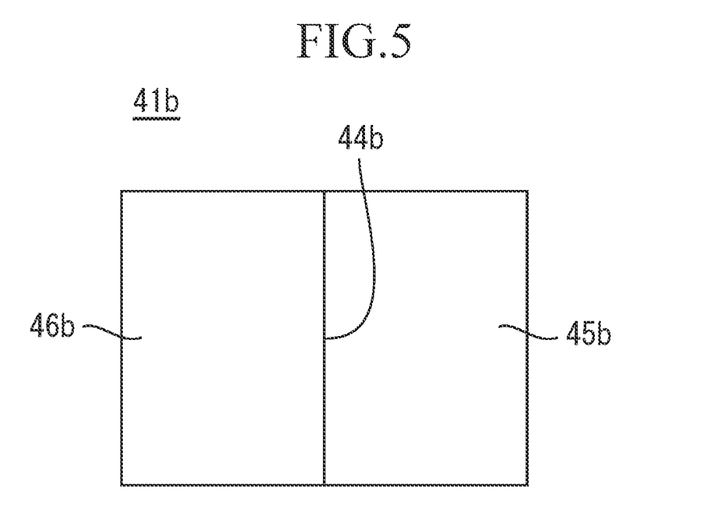
FIG. 5 is a bottom view illustrating a first surface according to a first modification.
Figure 6:
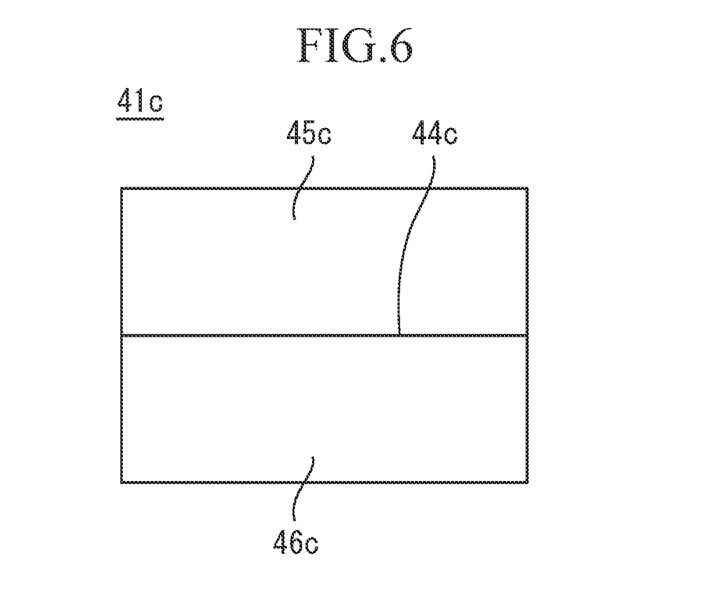
FIG. 6 is a bottom view illustrating a first surface according to a second modification.

FIG. 4 is a bottom view illustrating an example of a first surface 41a. FIG. 5 is a bottom view illustrating a first surface 41b according to a first modification. FIG. 6 is a bottom view illustrating a first surface 41c according to a second modification. In the example illustrated in FIG. 4, the first surface 41a is made up of four planes 45a to 48a that connect a vertex 44a and the edges. In the example illustrated in FIG. 5, a vertex 44b is formed along the lateral direction of the barrier layer 40. The first surface 41b is made up of two planes 45b, 46b provided on both sides of the vertex 44b. In the example illustrated in FIG. 6, a vertex 44c is formed along the longitudinal direction of the barrier layer 40. The first surface 41c is made up of two planes 45c, 46c provided on both sides of the vertex 44c. The present disclosure is not limited to these examples, and the first surface 41 only needs to have a plurality of planes connecting the center and the edges of the barrier layer 40. On the first surface 41, any surface connecting the vertex 44 and the peripheral portion is inclined.

Figure 7:
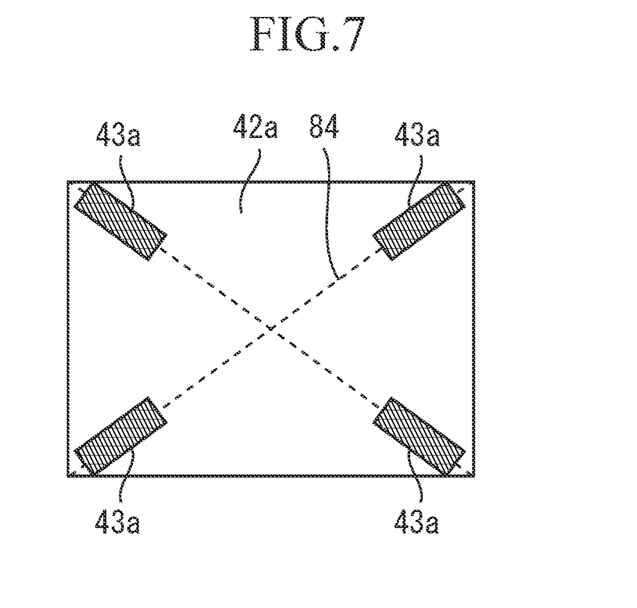
FIG. 7 is a plan view illustrating an example of convex parts.
Figure 8:
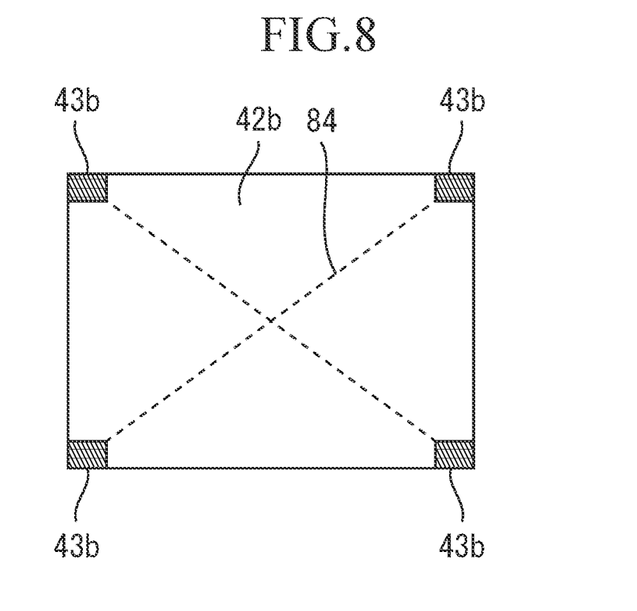
FIG. 8 is a plan view illustrating convex parts according to a first modification.
Figure 9:
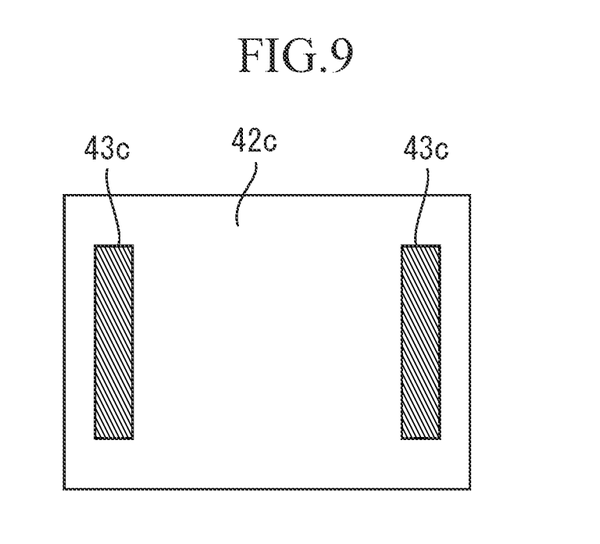
FIG. 9 is a plan view illustrating convex parts according to a second modification.
Figure 10:
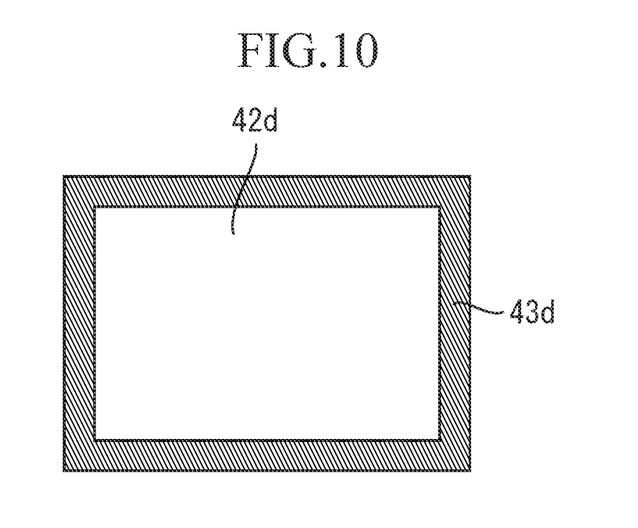
FIG. 10 is a plan view illustrating a convex part according to a third modification.

FIG. 7 is a plan view illustrating an example of convex parts 43a. FIG. 8 is a plan view illustrating convex parts 43b according to a first modification. FIG. 9 is a plan view illustrating convex parts 43c according to a second modification. FIG. 10 is a plan view illustrating a convex part 43d according to a third modification. In the example illustrated in FIG. 7, four convex parts 43a are provided on straight lines 84 connecting the center and four endpoints of a second surface 42a. In the example illustrated in FIG. 8, four convex parts 43b are provided at the corners of a second surface 42b. In the example illustrated in FIG. 9, two convex parts 43c extending in the lateral direction of a second surface 42c are provided on both sides in the longitudinal direction of the second surface 42c. In the example illustrated in FIG. 10, the convex part 43d is provided on the peripheral portion of a second surface 42d along four sides of the second surface 42d. The present disclosure is not limited to these examples, and the convex part 43 only needs to be provided at a position where the convex part 43 can hold the barrier layer 40 immediately above.

In the present embodiment, an upper surface 48 and a side surface 49 of the convex part 43 are perpendicular to each other. The present disclosure is not limited to this, but the side surface 49 may be inclined with respect to a direction perpendicular to the upper surface 48. The first surface 41 may have a portion not inclined at the edge.

At the time of mounting the barrier layer 40 on the sealing resin 20, the barrier layer 40 may be embedded in the sealing resin 20. That is, the sealing resin 20 may be further provided on the barrier layer 40, and the convex part 43 or the second surface 42 may be in contact with the sealing resin 20.

The semiconductor chips 14, 16 are, for example, switching devices or diodes. The semiconductor chips 14, 16 may be made with wide bandgap semiconductors. The wide bandgap semiconductor is, for example, silicon carbide, a gallium nitride-based material, or diamond. According to the present embodiment, the reliability can be ensured even when the semiconductor chips 14, 16 made with the wide bandgap semiconductors are operated at a high temperature.

These modifications can be appropriately applied to semiconductor devices and power converters according to embodiments below. Meanwhile, for the semiconductor devices and the power converters according to the embodiments below, dissimilarities with the first embodiment will mainly be explained as they have many similarities with the first embodiment.

Second Embodiment

Figure 11:
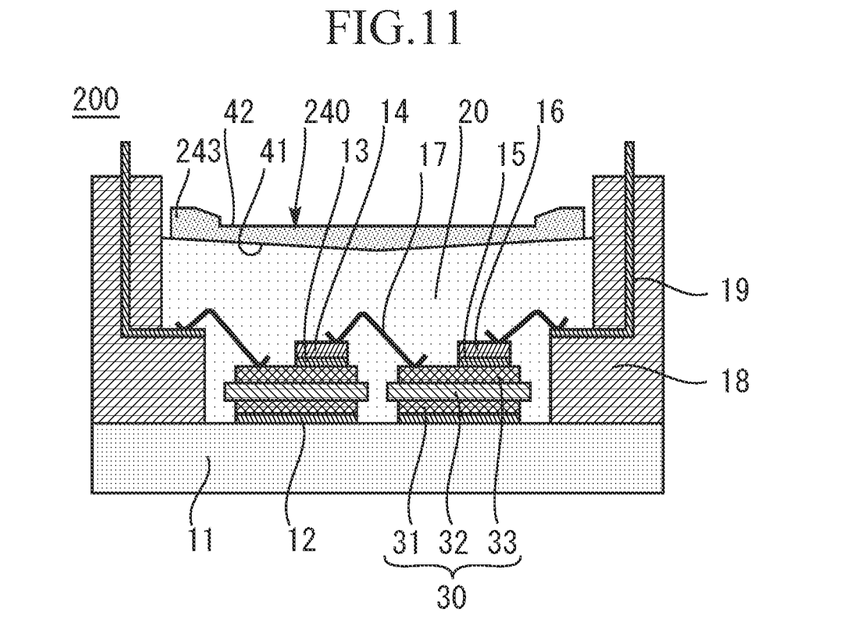
FIG. 11 is a cross-sectional view of a semiconductor device according to a second embodiment.
Figure 12:
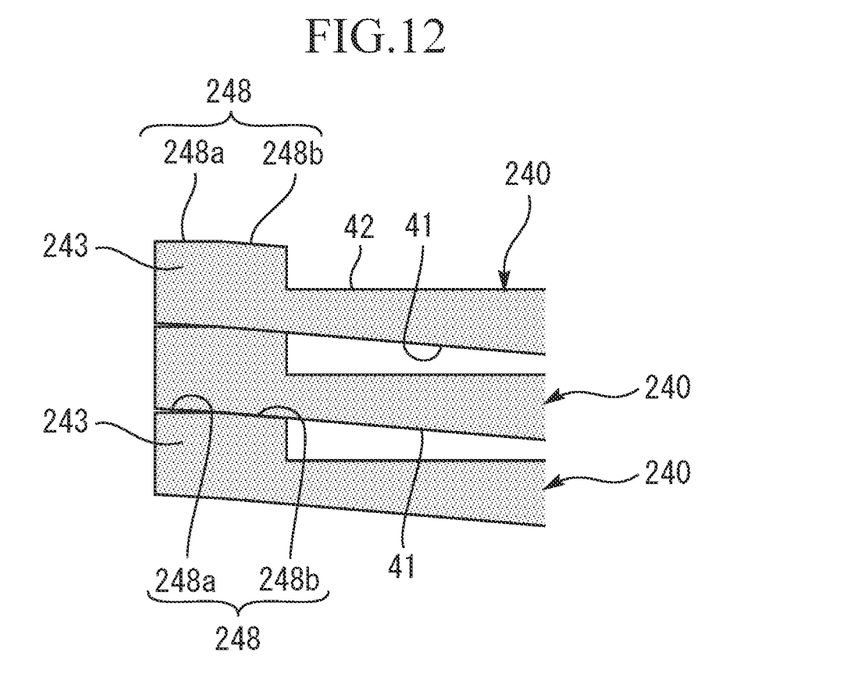
FIG. 12 is a view illustrating a state where barrier layers according to the second embodiment are stacked.

FIG. 11 is a cross-sectional view of a semiconductor device 200 according to a second embodiment. FIG. 12 is a view illustrating a state where barrier layers 240 according to the second embodiment are stacked. The semiconductor device 200 differs from the semiconductor device 100 in the configuration of the barrier layer 240. The other configurations are the same as those of the semiconductor device 100. The barrier layer 240 has a convex part 243. An upper surface 248 of the convex part 243 has a horizontal portion 248a parallel to the second surface 42 and an inclined portion 248b inclined with respect to the horizontal portion 248a. The inclined portion 248b is inclined along a portion of the first surface 41 immediately below the convex part 243.

In the present embodiment, in a state where the barrier layers 240 are stacked, the inclined portion 248b and the first surface 41 are in surface contact with each other. This enables more stable loading. When the barrier layer 240 is to be obtained using a machine, the barrier layer 240 may be obtained by vacuum adsorption. At this time, it is assumed that the barrier layer 240 is adsorbed while being pushed. In the present embodiment, the contact area between the barrier layers 240 is ensured, so that the barrier layer 240 can be kept in a stable state when the barrier layer 240 is pushed.

The entire upper surface 248 of the convex part 243 may be formed of the inclined portion 248b. The inclined portion 248b may be provided in some of the plurality of convex parts 243.

Third Embodiment

Figure 13:
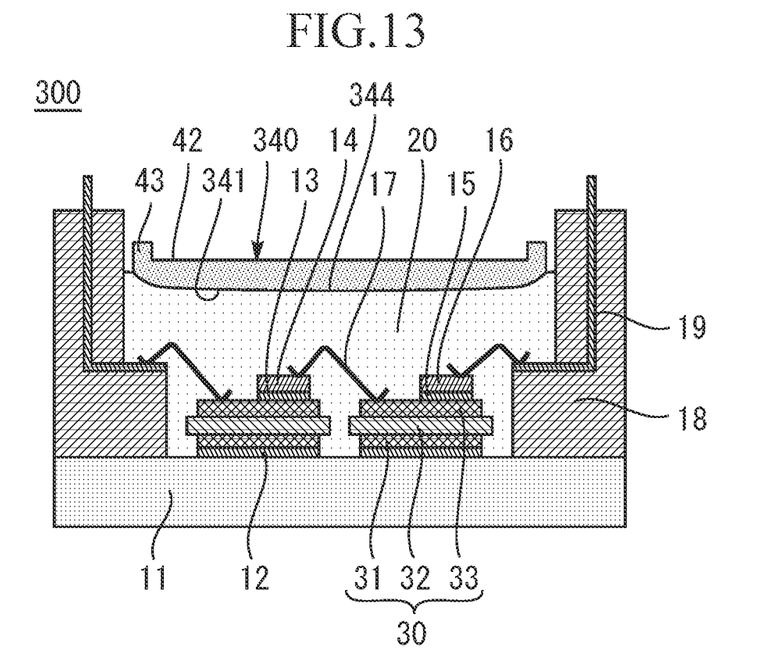
FIG. 13 is a cross-sectional view of a semiconductor device according to a third embodiment.

FIG. 13 is a cross-sectional view of a semiconductor device 300 according to a third embodiment. The semiconductor device 300 differs from the semiconductor device 100 in the configuration of a barrier layer 340. The other configurations are the same as those of the semiconductor device 100. A first surface 341 of the barrier layer 340 is formed of a curved surface.

In the present embodiment, with the first surface 341 being formed of the curved surface, it is possible to reduce a bent portion of the barrier layer 340 at the contact portion with the sealing resin 20. It is thereby possible to reduce a portion where bubbles 51 are easily restrained when the bubbles 51 are discharged to the outside of the sealing resin 20. Therefore, the bubbles 51 can be more reliably discharged, and the high-quality semiconductor device 300 can be provided.

The restraint of the bubbles 51 may also be caused by the surface roughness of the first surface 341. For discharging the bubbles 51 more reliably, the first surface 341 is desirably as smooth as possible.

On the first surface 341, the curved surface may continue from a vertex 344 to the outermost periphery of the barrier layer 340. A part of the first surface 341 may be formed of a curved surface. For example, in the first surface 341, a certain region from the vertex 344 may be formed of a curved surface, and the outside of the curved surface may be formed of a plane.

Fourth Embodiment

Figure 14:
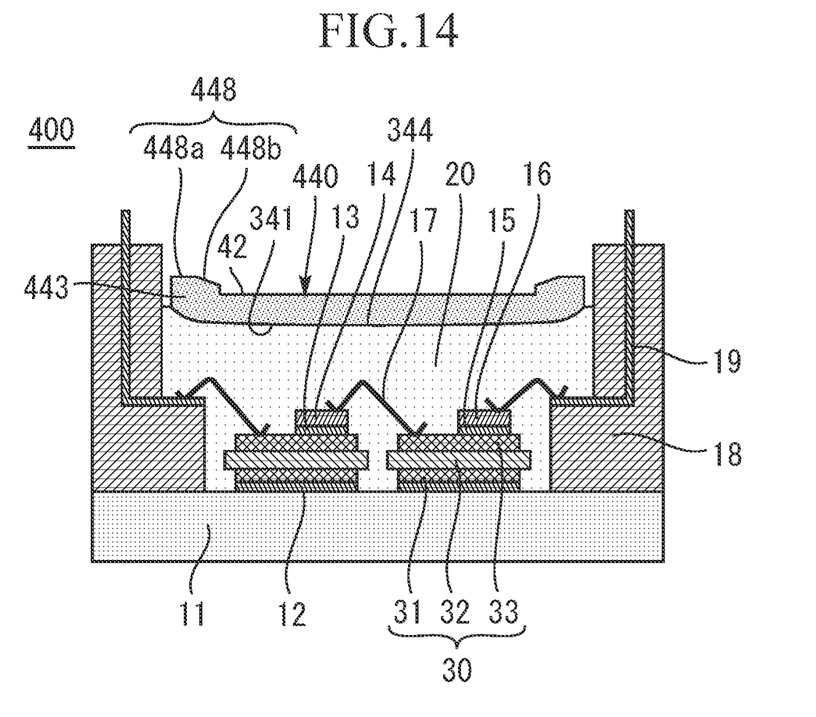
FIG. 14 is a cross-sectional view of a semiconductor device according to a fourth embodiment.

FIG. 14 is a cross-sectional view of a semiconductor device 400 according to a fourth embodiment. The semiconductor device 400 differs from the semiconductor device 300 in the configuration of a barrier layer 440. The other configurations are the same as those of the semiconductor device 300. The barrier layer 440 has a convex part 443. An upper surface 448 of the convex part 443 has a horizontal portion 448a parallel to the second surface 42 and an inclined portion 448b inclined with respect to the horizontal portion 448a. The inclined portion 448b is inclined along a portion of the first surface 341 immediately below the convex part 443.

In the present embodiment, in a state where the barrier layers 440 are stacked, the inclined portion 448b and the first surface 341 are in surface contact with each other. Therefore, as in the second embodiment, more stable loading is possible.

Fifth Embodiment

Figure 15:
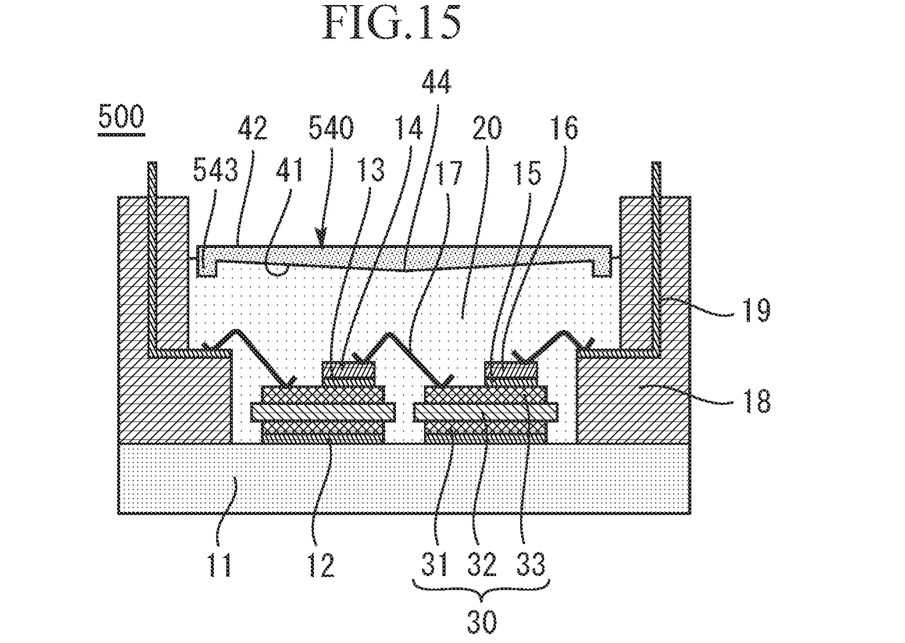
FIG. 15 is a cross-sectional view of a semiconductor device according to a fifth embodiment.

FIG. 15 is a cross-sectional view of a semiconductor device 500 according to a fifth embodiment. The semiconductor device 500 differs from the semiconductor device 100 in the configuration of a barrier layer 540. The other configurations are the same as those of the semiconductor device 100. The barrier layer 540 has a convex part 543 protruding downward from the first surface 41.

Figure 16:
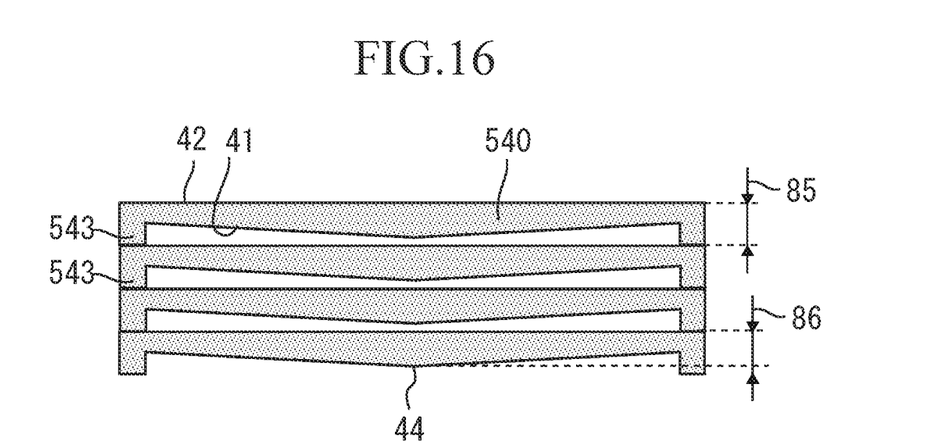
FIG. 16 is a view illustrating a state where the barrier layers according to the fifth embodiment are stacked.

FIG. 16 is a view illustrating a state where the barrier layers 540 according to the fifth embodiment are stacked. The convex part 543 is provided so as to be able to house the protrusion of the first surface 41. A height 85 of the convex part 543 from the second surface 42 is greater than a thickness 86 of the barrier layer 540 at the center of the barrier layer 540. In a state where the barrier layers 540 are stacked, the lower surface of the convex part 543 and the second surface 42 are in contact with each other. Therefore, the barrier layers 540 can be stacked stably.

The convex parts 543 are provided at least on both sides of the center of the barrier layer 540 while avoiding the center of the barrier layer 540, in the same manner as the convex parts 43 of the first embodiment. The placement of the convex part 543 on the first surface 41 is similar to the placement of the convex parts 43a, 43b, 43c on the second surfaces illustrated in FIGS. 7, 8, and 9, for example. The present disclosure is not limited to these examples, and the convex part 543 only needs to be provided at a position where the convex part 543 can hold the barrier layer 540.

Here, as illustrated in FIG. 10, in the configuration where the convex part 43d completely surrounds the center of the barrier layer 40 in plan view, the bubbles 51 trapped during the mounting of the barrier layer 540 cannot be released to the outside of the barrier layer 540. Thus, the convex part 543 is preferably provided while avoiding a part of the outer periphery of the center of the barrier layer 540. This enables the bubbles 51 to be discharged to the outside of the barrier layer 540.

In the present embodiment, the convex part 543 is provided on the first surface 41 side of the barrier layer 540. Hence the second surface 42 can be formed of a plane while the barrier layers 540 can be stacked. As a result, at the time of loading a control substrate or the like on the barrier layer 540, it is possible to prevent the structure of the barrier layer 540 from interfering with the loading.

In the present embodiment as well, for example, as illustrated in FIGS. 4, 5, and 6, the first surface 41 may have a plurality of planes connecting the center and the edges of the barrier layer 540. As illustrated in FIG. 13, the first surface 41 may be formed of a curved surface.

Sixth Embodiment

In the present embodiment, the semiconductor devices 100, 200, 300, 400 according to the first to fifth embodiments are applied to a power converter. Although the present disclosure is not limited to a specific power converter, an instance in which the present disclosure is applied to a three-phase inverter will be described below as a sixth embodiment.

Figure 17:
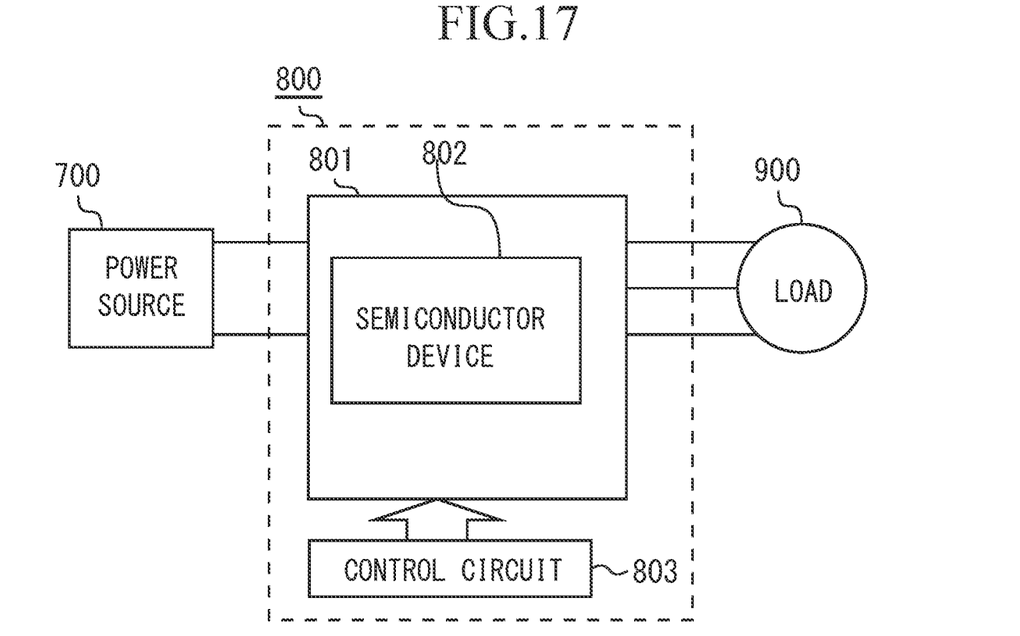
FIG. 17 is a block diagram illustrating a configuration of a power conversion system to which a power converter according to the sixth embodiment is applied.

FIG. 17 is a block diagram illustrating a configuration of a power conversion system to which a power converter 800 according to the sixth embodiment is applied.

The power conversion system illustrated in FIG. 17 is made up of a power source 700, the power converter 800, and a load 900. The power source 700 is a direct-current (DC) power source and supplies DC power to the power converter 800. The power source 700 can be made up of various components. The power source 700 can be made of, for example, a DC system, a solar cell, or a storage battery. The power source 700 may be made of a rectifier circuit or an AC-to-DC converter connected to an AC system. The power source 700 may be made of a DC-to-DC converter that converts DC power output from the DC system into a predetermined power.

The power converter 800 is a three-phase inverter connected between the power source 700 and the load 900. The power converter 800 converts the DC power supplied from the power source 700 into alternating-current (AC) power and supplies the AC power to the load 900. As illustrated in FIG. 17, the power converter 800 includes a main conversion circuit 801 and a control circuit 803. The main conversion circuit 801 converts DC power into AC power and outputs the AC power. The control circuit 803 outputs a control signal, which controls the main conversion circuit 801, to the main conversion circuit 801.

The load 900 is a three-phase electric motor driven by AC power supplied from the power converter 800. The load 900 is not limited to a specific application but is an electric motor mounted on each of various electric apparatuses. The load 900 is used, for example, as an electric motor for a hybrid vehicle, an electric vehicle, a railway vehicle, an elevator, or an air conditioner.

The power converter 800 will be described in detail below. The main conversion circuit 801 includes a switching device and a reflux diode (not illustrated). The main conversion circuit 801 converts the DC power supplied from the power source 700 into AC power by the switching of the switching device and supplies the AC power to the load 900. Although there are various specific circuit configurations of the main conversion circuit 801, the main conversion circuit 801 according to the present embodiment is a two-level three-phase full-bridge circuit. The main conversion circuit 801 can be made up of six switching devices and six reflux diodes antiparallel to the respective switching devices. At least either each switching device or each reflux diode of the main conversion circuit 801 is a switching device or a reflux diode of a semiconductor device 802 corresponding to the semiconductor device in any of the first to fifth embodiments described above. The six switching devices are connected in series for each two switching devices to constitute upper and lower arms. The upper and lower arms constitute the respective phases of the U-phase, V-phase, and W-phase of the full-bridge circuit. The output terminals for the respective upper and lower arms, that is, three output terminals of the main conversion circuit 801 are connected to the load 900.

The main conversion circuit 801 includes a drive circuit (not illustrated) that drives each switching device. The drive circuit may be incorporated in the semiconductor device 802 or may be provided separately from the semiconductor device 802. The drive circuit generates a drive signal for driving the switching device of the main conversion circuit 801 and supplies the drive signal to the control electrode of the switching device of the main conversion circuit 801. Specifically, the drive circuit outputs a drive signal for turning on the switching device and a drive signal for turning off the switching device to the control electrode of each switching device in accordance with a control signal from the control circuit 803 described later. When the switching device is kept in an on-state, the drive signal is an on-signal that is a signal with a voltage equal to or higher than the threshold voltage of the switching device. When the switching device is kept in an off-state, the drive signal is an off-signal that is a signal with a voltage equal to or lower than the threshold voltage of the switching device.

The control circuit 803 controls the switching devices of the main conversion circuit 801 so that the desired power is supplied to the load 900. Specifically, based on the power to be supplied to the load 900, the control circuit 803 calculates an on-time at which each switching device of the main conversion circuit 801 is to be turned on. The control circuit 803 can control the main conversion circuit 801 by, for example, pulse-width modulation (PWM) control for modulating the on-time of the switching device in accordance with the voltage to be output. The control circuit 803 outputs a control signal, which is a control command, to the drive circuit provided in the main conversion circuit 801 so that the on-signal is output to the switching device to be turned on and the off-signal is output to the switching device to be turned off at each time point. In accordance with the control signal, the drive circuit outputs the on-signal or the off-signal as the drive signal to the control electrode of each switching device.

In the power converter 800 according to the present embodiment, the semiconductor device according to any one of the first to fifth embodiments is applied as the semiconductor device 802 constituting the main conversion circuit 801. Therefore, it is possible to provide the power converter 800 of stable quality.

In the present embodiment, the example of applying the present disclosure to the two-level three-phase inverter has been described. The present disclosure is not limited thereto but can be applied to various power converters. The power converter is not limited to two levels but may have three levels or multiple levels. When power is to be supplied to a single-phase load, the present disclosure may be applied to a single-phase inverter. When power is to be supplied to a DC load or the like, the present disclosure is also applicable to a DC-to-DC converter or an AC-to-DC converter.

The power converter 800 to which the present disclosure is applied is not limited to the instance described above in which the load 900 is the electric motor. For example, the power converter 800 is also usable as a power device for an electric discharge machine, a laser machine, an induction heating cooker, or a non-contact power supply system. The power converter 800 is also usable as a power conditioner for a photovoltaic power generation system, a power storage system, or the like.

Meanwhile, technical features explained in each embodiment may be appropriately combined to use.

In the semiconductor devices according to the first and second disclosure, the protruding portion on the first surface side of the barrier layer can be housed in the space formed by the convex parts when the barrier layer is stacked. Therefore, the barrier layers can be stacked stably.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-196241, filed on Nov. 26, 2020 including specification, claims, drawings and summary, on which the Convention priority of the present application is based, are incorporated herein by reference in its entirety.

The invention claimed is:

1. A semiconductor device comprising:
a base plate;
a case that surrounds a region immediately above the base plate in plan view;
a semiconductor chip provided in the region;
a sealing resin that fills the region; and
a barrier layer provided on the sealing resin,
wherein the barrier layer has
a first surface facing the base plate,
a second surface opposite to the first surface, and
a convex part protruding upward from the second surface, the first surface has the shortest distance to the base plate at a center of the barrier layer and has a continuously longer distance to the base plate as getting farther from the center, the convex part is provided at least on each of both sides of the center, while avoiding the center, and a height of the convex part from the second surface is greater than a distance in a thickness direction of the barrier layer between a portion of the first surface immediately below the convex part and a portion of the first surface provided at the center.

2. The semiconductor device according to claim 1, wherein an upper surface of the convex part has a portion inclined along the portion of the first surface immediately below the convex part.

3. A semiconductor device comprising:
a base plate;
a case that surrounds a region immediately above the base plate in plan view;
a semiconductor chip provided in the region;
a sealing resin that fills the region; and
a barrier layer provided on the sealing resin,
wherein the barrier layer has
a first surface facing the base plate,
a second surface opposite to the first surface, and
a convex part protruding downward from the first surface,
the first surface has the shortest distance to the base plate at a center of the barrier layer and has a continuously longer distance to the base plate as getting farther from the center,
the convex part is provided at least on each of both sides of the center, while avoiding the center, and
a height of the convex part from the second surface is greater than a thickness of the barrier layer at the center.

4. The semiconductor device according to claim 3, wherein the convex part is provided while avoiding a part of an outer periphery of the center.

5. The semiconductor device according to claim 3, wherein the second surface is formed of a plane.

6. The semiconductor device according to claim 1, wherein the first surface has a plurality of planes connecting the center and edges of the barrier layer.

7. The semiconductor device according to claim 1, wherein the first surface is formed of a curved surface.

8. The semiconductor device according to claim 1, wherein the barrier layer is made with a material having a lower permeability to moisture or gas than the sealing resin.

9. The semiconductor device according to claim 1, wherein the sealing resin is made with silicone gel or epoxy resin.

10. The semiconductor device according to claim 1, wherein the semiconductor chip is made with a wide bandgap semiconductor.

11. The semiconductor device according to claim 10, wherein the wide bandgap semiconductor is silicon carbide, a gallium nitride-based material, or diamond.

12. A power converter comprising:
a main conversion circuit that has the semiconductor device according to claim 1 and that converts input power and outputs the converted input power; and
a control circuit that outputs a control signal for controlling the main conversion circuit to the main conversion circuit.

13. The semiconductor device according to claim 3, wherein the first surface has a plurality of planes connecting the center and edges of the barrier layer.

14. The semiconductor device according to claim 3, wherein the first surface is formed of a curved surface.

15. The semiconductor device according to claim 3, wherein the barrier layer is made with a material having a lower permeability to moisture or gas than the sealing resin.

16. The semiconductor device according to claim 3, wherein the sealing resin is made with silicone gel or epoxy resin.

17. The semiconductor device according to claim 3, wherein the semiconductor chip is made with a wide bandgap semiconductor.

18. The semiconductor device according to claim 17, wherein the wide bandgap semiconductor is silicon carbide, a gallium nitride-based material, or diamond.

19. A power converter comprising:
a main conversion circuit that has the semiconductor device according to claim 3 and that converts input power and outputs the converted input power; and
a control circuit that outputs a control signal for controlling the main conversion circuit to the main conversion circuit.

* * * * *